United States Patent
Myers

(10) Patent No.: US 6,751,268 B1
(45) Date of Patent: Jun. 15, 2004

(54) BANDPASS PREDISTORTING EXPANSION METHOD AND APPARATUS FOR DIGITAL RADIO TRANSMISSION

(75) Inventor: Michael H. Myers, Poway, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 712 days.

(21) Appl. No.: 09/624,149

(22) Filed: Jul. 24, 2000

(51) Int. Cl.$^7$ .............................................. H04L 25/49
(52) U.S. Cl. ...................................................... 375/296
(58) Field of Search ................................. 375/296, 285

(56) References Cited

U.S. PATENT DOCUMENTS 5,867,065 A * 2/1999 Leyendecker ............... 330/149

* cited by examiner

*Primary Examiner*—Stephen Chin
*Assistant Examiner*—Kevin Kim
(74) *Attorney, Agent, or Firm*—John A. Miller; Warn, Burgess & Hoffmann, P.C.

(57) ABSTRACT

An apparatus for and a method of generating an envelope predistorted radio frequency signal. A complex baseband signal, having an in-phase component I and a quadrature component Q, is sampled and filtered. The magnitude $u_k$ of each complex baseband sample pair is determined by the square root of the sum of the squares of the in-phase component sample and the quadrature component sample. A distortion factor $D_k$, is determined based on a scaled value of the inverse hyperbolic tangent or archyperbolic tangent ("atanh") of the baseband sample magnitude divided by that scaled sample magnitude. Each sample of the in-phase component $I_k$ and of the quadrature component $Q_k$ is multiplied by the corresponding distortion factor $D_k$ so as to provide predistorted components. The predistorted components are then combined to provide a predistorted baseband signal.

40 Claims, 3 Drawing Sheets

BANDPASS PREDISTORTING EXPANSION METHOD AND APPARATUS FOR DIGITAL RADIO TRANSMISSION

FIELD OF THE INVENTION

The present invention pertains to an apparatus for and a method of predistorting a complex baseband signal. More particularly, the present invention pertains to an apparatus for and a method of generating an amplitude modulated radio frequency signal by predistorting its baseband signal using the inverse hyperbolic tangent of a value based on the envelope of the baseband in-phase and quadrature signals.

BACKGROUND OF THE INVENTION

The outputs from many solid state power amplifiers include distortion that can be characterized by a hyperbolic tangent function. Various radio applications, such as VHF data radio utilized by commercial airliners, must meet spectrum mask requirements imposed by regulatory agencies, such as the United States Federal Communications Commission. The transmit spectrum of such a radio signal can spread near the desired signal band if the envelope of the transmitted signal is not constant, particularly if the transmitter power amplifier is being driven into soft saturation. While spurious emissions might be reduced by predistorting of the radio frequency signal envelope just before transmission to the output power amplifier, this requires analog multipliers. Even then, if noise is picked up in the multiplier circuit, that noise will modulate the desired signal and pass through to the output.

SUMMARY OF THE INVENTION

The present invention is an apparatus for and a method of generating an amplitude modulation of a desired radio frequency signal such that after passing through the nonlinear power amplifier, undesirable spurious emissions in the resulting spectrum are reduced. In accordance with the present invention, a complex amplitude modulated baseband signal, having an in-phase component I and a quadrature component Q, is sampled to obtain samples $I_k$ of the in-phase component and samples $Q_k$ of quadrature component, and the magnitude of the envelope of the baseband sample is determined by finding the square roots of the sums of the squares of the in-phase component samples and the quadrature component samples. A distortion factor equal to the inverse hyperbolic tangent or archyperbolic tangent ("atanh") of a scaled value of the complex baseband sample magnitude divided by that scaled sample magnitude is used to multiply each sample of the in-phase component and of the quadrature component so as to provide predistorted components. These predistorted components are then upsampled, upconverted, and combined to provide a predistorted intermediate frequency ("IF") carrier signal which is further upconverted to an analog radio frequency ("RF") signal and filtered, leaving the desired upconverted signal.

If desired, the scaling factor can be obtained by combining a portion of the output signal envelope with the undistorted envelope in a feedback circuit. The feedback circuit preferably computes the mean square error between the undistorted envelope and the output signal envelope. Preferably, to assure that the mean square error is computed correctly, both envelopes are normalized. The mean square error is adjusted by a fixed gain control and integrated, and the result used to scale the undistorted envelope prior to determination of the archyperbolic tangent function.

The envelope of the baseband signal is thus subjected to digital envelope predistortion prior to upconversion. This avoids impressing pick-up noise on the transmitted envelope. It is possible to do the predistortion prior to IF and RF bandpass filtering of the radio frequency signal since such filtering has a wide bandwidth, allowing the distorted signal spectrum to pass through the power amplifier.

In the prior art to predistortion has been achieved by subjecting the signal to an inverse nonlinearity, for example, by passing the linear signal y(t) through an inverse nonlinear predistorter to generate $f(y(t))=\text{atanh}(Cy(t))$. In contrast, the present invention multiplies y(t) by $\{\text{atanh}(Cy(t))\}/Cy(t)$, which can be considered an expander function.

Preferably, the predistortion apparatus of the present invention is implemented in a gate array, such as a field programmable gate array.

BRIEF DESCRIPTION OF THE DRAWINGS

These and other aspects and advantages of the present invention are more apparent from the following detailed description and claims, particularly when considered in conjunction with the accompanying drawings in which like parts bear like reference numerals. In the drawings:

DETAILED DESCRIPTION OF PREFERRED EMBODIMENTS

Figure 1:
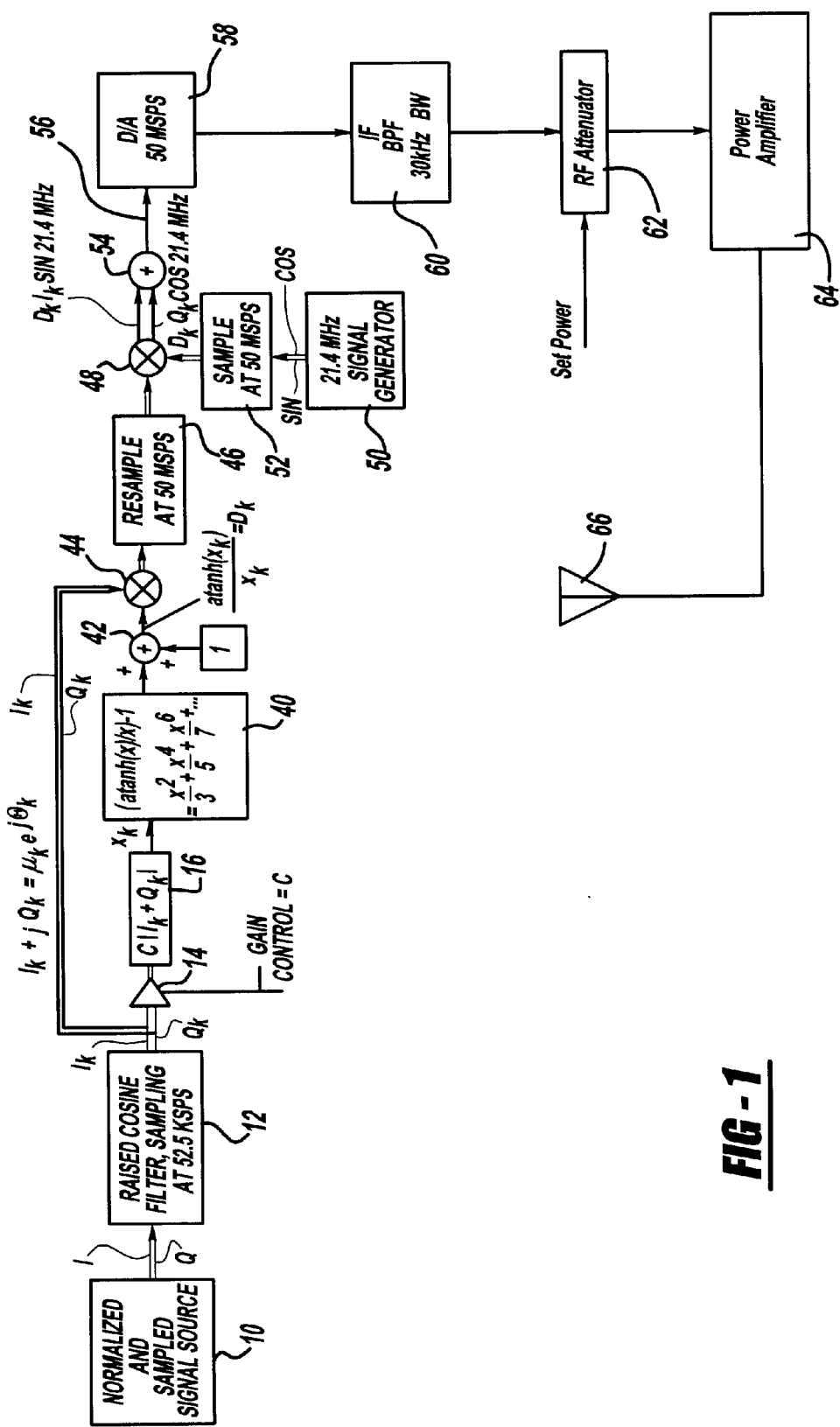
FIG. 1 is a block diagram of an apparatus for generating an envelope predistorted radio frequency signal in accordance with a first preferred embodiment of the present invention.

FIG. 1 depicts an apparatus for generating an envelope predistorted radio frequency signal in accordance with a first preferred embodiment of the present invention. A signal source 10 provides a complex baseband signal, including an in-phase component I and a quadrature component Q that are normalized and sampled at, for example, 10.5 kilosamples per second (KSPS). From source 10, the samples are applied to filter circuit 12, which might include a pair of raised cosine filters for shaping differential eight-phase shift keying (D8PSK) modulation, one filter for the in-phase component and one for the quadrature component. Filter circuit 12 resamples the provided signals at a multiple of the sampling rate of source 10, shown in FIG. 1 as a resampling rate of 52.5 KSPS. The samples of the in-phase component $I_k$ and the quadrature component $Q_k$ are applied from filters 12 to a gain control amplifier pair 14 that receives a gain control or scaling signal, which might be a constant value, from an appropriate source such as system software. A multiplier pair could be used in place of the gain control amplifier pair. The output of gain control amplifier pair 14 is applied to a calculation circuit 16 which calculates the magnitude of the scaled complex baseband envelope sample by determining the square root of the sum of the squares of the scaled in-phase component sample and the scaled quadrature component sample.

Figure 2:
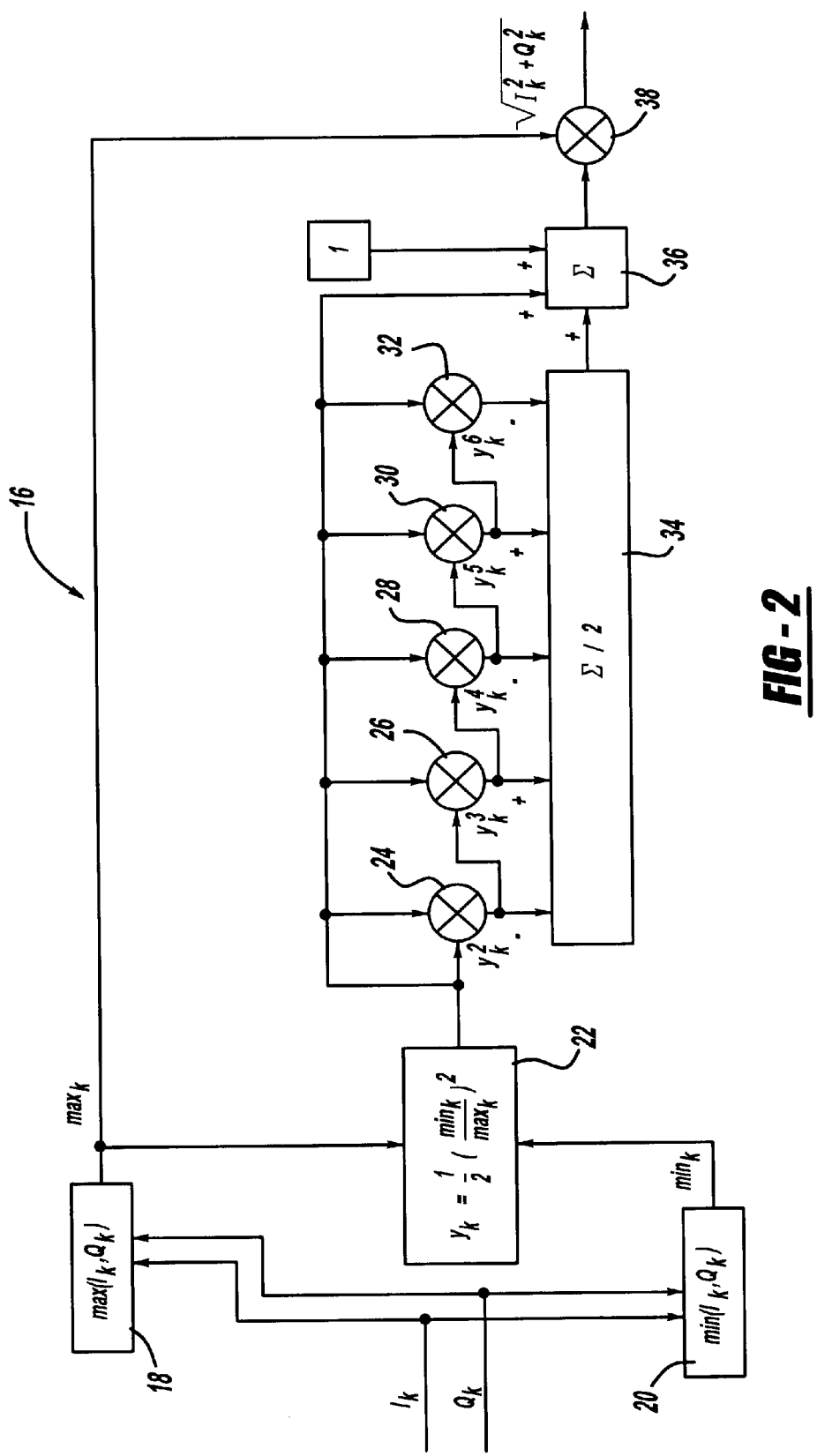
FIG. 2 is a block diagram of one preferred embodiment of a circuit suitable for use in the apparatus of FIG. 1.

FIG. 2 is a block diagram of one preferred embodiment of an apparatus for determining an approximation of the magnitude of each complex sample k of the baseband signal. In FIG. 2 an in-phase component $I_k$ and a quadrature component $Q_k$ of a normalized baseband signal, which have been sampled at an appropriate sampling rate such as 52.5 KSPS, are applied to a first detection circuit 18 which determines the maximum of these components by determining for each sample pair whether the $I_k$ component or the $Q_k$ component is the larger. The $I_k$ component and the $Q_k$ component samples are also applied to a second detection circuit 20 which determines the minimum of these components by determining for each sample pair whether the $I_k$ component or the $Q_k$ component is the smaller. The detected maximum value ("$\max_k$") and the detected minimum value ("$\min_k$") for each sample pair are applied to calculating circuit 22 which computes the value $y_k = \frac{1}{2}(\min_k/\max_k)^2$.

The $y_k$ output from calculating circuit 22 is applied as an input to each of five multiplier circuits 24, 26, 28, 30 and 32. The $y_k$ output is also applied to a second input of multiplier 24. As a consequence, multiplier 24 provides as an output the value $y_k^2$. This $y_k^2$ output from multiplier 24 is applied to the second input of multiplier 26 and to a negative input to summation circuit 34. The output of multiplier 26 is thus the value $y_k^3$. This output is applied to the second input of multiplier 28 and to a positive input of summation circuit 34. Multiplier 28 accordingly provides the output $y_k^4$ which is used as the second input to multiplier 30 and which is applied to a negative input to summation circuit 34. Multiplier 30 then provides the output $y_k^5$ to the second input of multiplier 32 and to a positive input to summation circuit 34. Multiplier 32 provides the output $y^6$ to a negative input to summation circuit 34.

Summation circuit 34 divides the sum of its inputs by 2, thus providing as its output the value $\frac{1}{2}(-y_k^2+y_k^3-y_k^4+y_k^5-y_k^6)$. This signal is applied as an input to summation circuit 36, which also receives as inputs the $y_k$ signal from calculation circuit 22 and the constant 1. The output of summation circuit 36 is thus the value $\{1+y_k+\frac{1}{2}(-y_k^2+y_k^3-y_k^4+y_k^5-y_k^6)\}$. This is equal to the value $\{(1+y_k)/2+\frac{1}{2}(1+y_k-y_k^2+y_k^3-y_k^4+y_k^5-y_k^6)\}$. This signal is applied from summation circuit 36 to one input of multiplier 38, which receives the $\max_k$ signal from detection circuit 18 at its second input. Consequently, the output of multiplier 38 is $$(\max_k)\times\{(1+y_k)/2+\frac{1}{2}(1+y_k-y_k^2+y_k^3-y_k^4+y_k^5-y_k^6)\}$$

which is an approximation of $(I_k^2+Q_k^2)^{1/2}=u_k$, and thus an approximation of the magnitude of the sample k.

Returning to FIG. 1, the input to calculation circuit 16 is $C \times I_k$ and $C \times Q_k$, and so the output from the calculation circuit is $C \times (I_k^2+Q_k^2)^{1/2}=C \times u_k=x_k$. This $x_k$ output is applied as an input to calculation circuit 40 which determines a value $x_k^2/3+x_k^4/5+x_k^6/7+\ldots$ which is an approximation of the value $\{(\operatorname{atanh}(x_k))/x_k\}-1$. Calculation circuit 40 might be a look-up table for this purpose, having values to 16 bits. The output of calculation circuit 40 is applied to one input of summation circuit 42 which receives the constant 1 at its second input. It is preferred that calculation circuit 40, when in the form of a look-up table, compute the value of the segment $\{(\operatorname{atanh}(x_k))/x_k\}-1$, and that the constant 1 be added at summation circuit 42 in order to provide the desired accuracy while maintaining the look-up table of a moderate size.

The output of summation circuit 42 is thus the distortion factor $(\operatorname{atanh}(x_k))/x_k=(\operatorname{atanh}(Cu_k))/Cu_k=D_k$. This distortion factor is applied to one input of multiplier pair 44, which also receive the $u_k$ samples of the in-phase component $I_k$ and the quadrature component $Q_k$ from filter circuit 12. Each sample of the in-phase component $I_k$ and the quadrature component $Q_k$ is thus modified by the distortion factor $D_k$, so that the output of multiplier pair 44 is $e^{j\Theta_k}(\operatorname{atanh}(Cu_k))/C$. These samples of the modified signal are then resampled at a high rate, such as 50 megasamples per second (MSPS) in resampling circuit 46, and the resulting samples are applied to multiplier pair 48. A signal generator 50 applies sine and cosine outputs to sampling circuit 52. Signal generator 50 operates at a frequency less than half the sampling rate of resampling circuit 46, depicted in FIG. 1 as a frequency of 21.4 MHz. Sampling circuit 52 samples the sine and cosine outputs from signal generator 50 at the same sampling rate as used by sampling circuit 46, depicted in FIG. 1 as 50 MSPS. The sampled sine and cosine signals from sampling circuit 52 are applied to multiplier pair 48 so that the multiplier pair provide as outputs the intermediate frequency signal $D_k \times I_k \sin 21.4$ MHz and $D_k \times Q_k \cos 21.4$ MHz. These signals are applied to summation circuit 54 which adds them to provide the predistorted upconverted intermediate frequency signal on its output line 56.

This predistorted intermediate frequency signal is applied to digital-to-analog converter 58, which samples at the same rate as sampling circuit 46, shown in FIG. 1 as 50 MSPS. The output of digital-to-analog converter 58 is applied to band pass filter 60. Band pass filter 60 is centered at the frequency of signal generator 50, depicted in FIG. 1 as 21.4 MHz, and, has a bandwidth sufficient to avoid distortion of the predistorted envelope, for example a bandwidth in the order of 30 kHz. From band pass filter 60 the signal is applied to radio frequency attenuator 62 which receives an input, such as a constant value from system software, to set its power level. The output of attenuator 62 is $V(t)=e^{j\Theta(t)}$ $(\operatorname{atanh}(Cu_k))/C$. This signal is then applied to power amplifier 64 which has a transfer function of $b \times \tanh(C \times V(t))$, where b is a constant. The output from power amplifier 64 is $b \times Cu(t)e^{j\Theta(t)}$. Preferably, the gain control or scaling signal applied to gain control amplifier pair 14 is equal to C.

Figure 3:
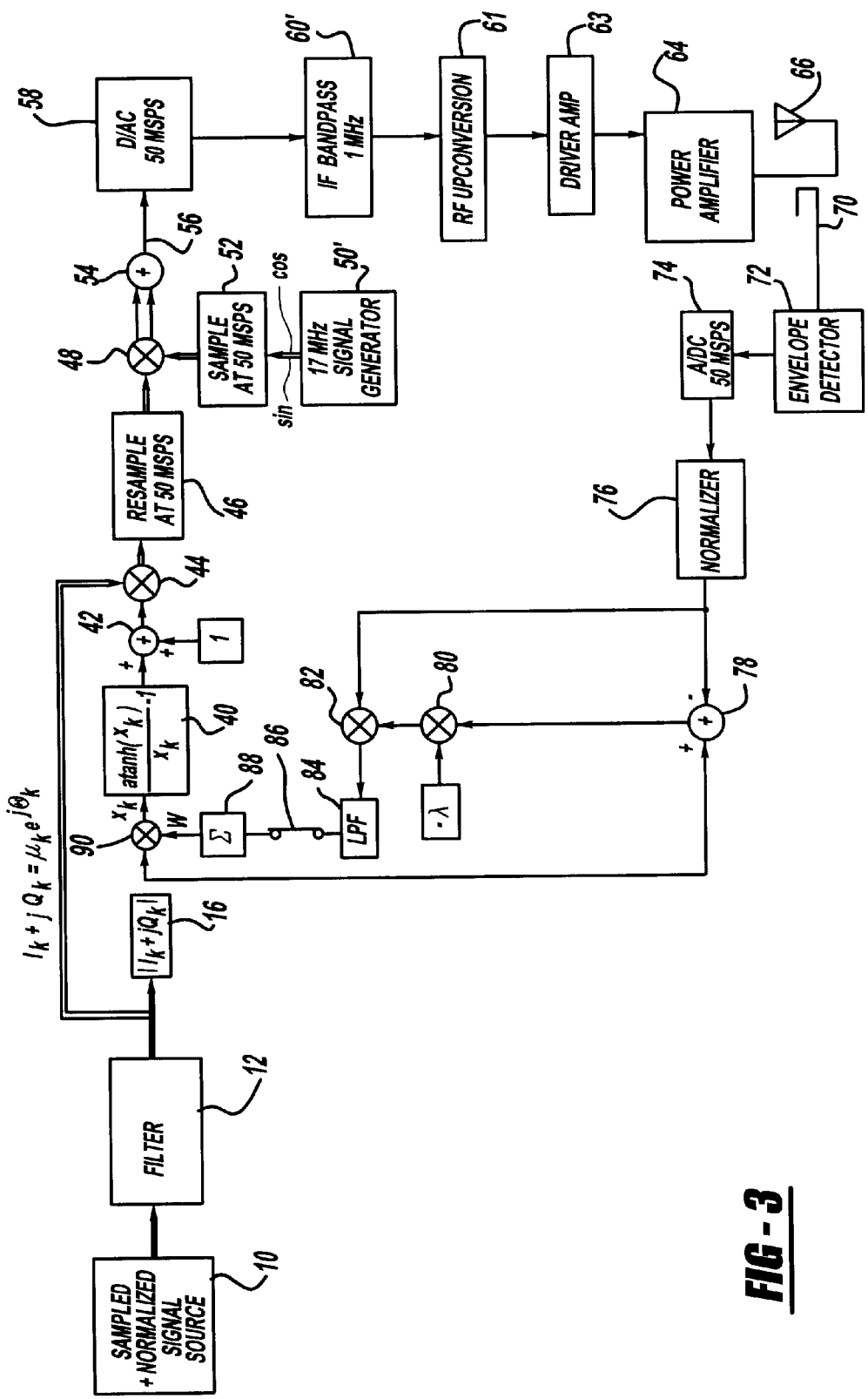
FIG. 3 is a block diagram of an apparatus for generating an envelope predistorted radio frequency signal in accordance with a second preferred embodiment of the present invention.

FIG. 3 depicts an apparatus for generating an envelope predistorted radio frequency signal in accordance with a second preferred embodiment of the present invention in which the scaling factor is determined by an adaptive feedback loop based on the root mean square error of the signal from the output power amplifier. Signal source 10 provides a complex baseband signal that is normalized and sampled and applied to filter circuit 12. The samples of the in-phase component and the quadrature component are applied to calculation circuit 16, which can be the circuit of FIG. 2. The output of calculation circuit 16 is thus $(I_k^2+Q_k^2)^{1/2}=U_k$. The output from the apparatus of FIG. 3 is provided by power amplifier 64, and radio frequency coupler 70 couples a portion of that output to linear envelope detector 72. The detected envelope is applied to analog-to-digital converter 74 which samples at the same rate as digital-to-analog converter 58, depicted in FIG. 3 as 50 MSPS.

The sampled output from analog-to-digital converter 74 is normalized to the maximum amount by normalizing circuit 76. The output of calculation circuit 16 is applied to a positive input of summing circuit 78, while the output from normalizing circuit 76 is applied to a negative input of the summing circuit. The input to summing circuit 78 from calculation circuit 16 represents the envelope before distortion, while the input to summing circuit 78 from normalizing circuit 76 represents the envelope after distortion. The resulting signal is applied by circuit 78 to one input of multiplier 80 which receives a weighting factor of $-\lambda$ at its second input. The output from multiplier 80 is applied to one input of multiplying circuit 82 which receives the output from normalizing circuit 76 at its second input. The output from multiplying circuit 82 is applied through low pass filter 84 to sampler 86 which applies a sample of that output at periodic intervals of, for example, one minute to integrator 88. The output of integrator 88 is a scaling factor W and is applied to one input of multiplying circuit 90 which receives the $u_k$ outputs from calculation circuit 16 at its second input. The output of multiplier circuit 90 is thus $W \times u_k = x_k$. This output is applied to calculation circuit 40 which calculates the value $\{(\text{atanh}(x_k))/x_k\} - 1$, as in the embodiment of FIG. 1.

As in the embodiment of FIG. 1, the output of calculation circuit 40 is applied to summing circuit 42 in which the constant 1 is added, so that summing circuit 42 applies to multiplier pair 44 the distortion factor $(\text{atanh}(x_k))/x_k = (\text{atanh}(Wu_k))/Wu_k = D_k$. The $u_k$ samples of the in-phase component $I_k$ and the quadrature component $Q_k$ are also applied to multiplier pair 44. Each sample of the in-phase component $I_k$ and the quadrature component $Q_k$ is thus modified by the respective distortion factor $D_k$, so that the output of multiplier pair 44 is $e^{j\Theta_k} (\text{atanh}(Wu_k))/W$. These samples of the modified signal are resampled in resampling circuit 46 at a high sampling rate, shown in FIG. 3 as a resampling rate at 50 MSPS.

The resampled output from resampling circuit 46 is applied to multiplier pair 48. Signal generator 50' provides an intermediate frequency signal of a frequency less than half the sampling rate of resampling circuit 46, shown in FIG. 3 as a frequency of 17 MHz. Sampling circuit 52 samples the sine and cosine outputs from signal generator 50' at the same sampling rate as resampling circuit 46, shown in FIG. 3 as a sampling rate of 50 MSPS. These sampled sine and cosine signals are applied to multiplier pair 48 so that the multiplier pair provides as outputs the intermediate frequency signals $D_k \times I_k$ sin 17 MHz and $D_k \times I_k$ cos 17 MHz. These signals are added in summation circuit 54, and the resulting predistorted, upconverted intermediate frequency signal is applied on line 56 to digital-to-analog converter 58 which samples at the same 50 MSPS rate as resampling circuit 46.

The output from digital-to-analog converter 58 is applied to band pass filter 60' which is centered at the 17 MHz frequency of signal source 50' and which has a bandwidth sufficient to avoid distortion of the predistorted envelope, for example a bandwidth of MHz. The output from bandpass filter 60' is upconverted to a radio frequency in upconverter 61 and passed through driver amplifier 63 and power amplifier 64 to antenna 66. If desired, a radio frequency attenuator could be utilized, rather than upconverter 61 and drive amplifier 63, as in the embodiment of FIG. 1. Likewise, an upconverter and a driver amplifier could be used in the FIG. 1 embodiment, if desired.

The feedback circuit of FIG. 3 results in the signal W that is applied from integrator 88 to multiplier 90 converging to the current value of C, the transfer function of output amplifier 64. It is possible to set the gain of the feedback loop so that it converges in just a few iterations. The value of the feedback gain $\lambda$ which guarantees stable conversion is upper bounded by the mean square value of the feedback envelope after being normalized by circuit 76.

Predistorting the digital envelope of the baseband signal before upconversion to the radio frequency, followed by digital-to-analog conversion, in accordance with the present invention avoids impressing of analog pickup noise directly on the transmitted envelope, as would occur if the envelope correction were performed on the radio frequency analog signal. Implementation of the present invention does not require significant hardware. It can be accomplished in software or firmware. Implementation on a gate array, such as a field programmable gate array, is convenient.

Although the present invention has been described with reference to preferred embodiments, various alterations, rearrangements, and substitutions could be made, and still the result would be within the scope of the invention.

What is claimed is:

1. A method of predistorting a complex baseband signal having an in-phase component I and a quadrature component Q, said method comprising the steps of:

sampling the complex baseband signal to obtain k samples of the in-phase component $I_k$ and of the quadrature component $Q_k$;

for each of the k samples determining a respective distortion factor $D_k$, wherein for each of the k complex samples the respective distortion factor $D_k$ is determined as $D_k = \text{atanh}(x_k)/x_k$, where $x_k$ is the magnitude of the sample k of the baseband signal;

multiplying each sample of the in-phase component $I_k$ and of the quadrature component $Q_k$ by its respective distortion factor $D_k$ to obtain a predistorted in-phase component sample and a predistorted quadrature component sample;

up-converting each of the predistorted in-phase component samples and each of the predistorted quadrature component samples to provide an up-converted, sampled in-phase signal and an up-converted, sampled quadrature signal; and combining the up-converted sampled in-phase signal and the up-converted sampled quadrature signal to provide a predistorted baseband signal.

2. A method as claimed in claim 1, wherein for each of the k samples a segment of the respective distortion factor $D_k$ is determined from a lookup table.

3. A method of predistorting a complex baseband signal having an in-phase component I and a quadrature component Q, said method comprising the steps of:

sampling the complex baseband signal to obtain k samples of the in-phase component $I_k$ and of the quadrature component $Q_k$;

for each of the k samples determining a respective distortion factor $D_k$, wherein determining a respective distortion factor includes determining the magnitude $I_k$ of each of the k samples of the in-phase component and the magnitude $Q_k$ of each of the k samples of the quadrature component, for each of the k pairs of corresponding samples of the in-phase component and of the quadrature component, determining a respective value of $x_k = (I_k^2 + Q_k^2)^{1/2}$, and for each value of $x_k$, determining a value of the respective distortion factor $D_k = (\text{atanh}(x_k))/x_k$;

multiplying each sample of the in-phase component $I_k$ and of the quadrature component $Q_k$ by its respective distortion factor $D_k$ to obtain a predistorted in-phase component sample and a predistorted quadrature component sample;

up-converting each of the predistorted in-phase component samples and each of the predistorted quadrature component samples to provide an up-converted, sampled in-phase signal and a sampled radio frequency quadrature signal; and combining the up-converted sampled in-phase signal and the up-converted sampled quadrature signal to provide a predistorted baseband signal.

4. A method as claimed in claim 3, wherein for each value of the $x_k$ the value of $(\text{atanh}(x_k))/x_k$ is determined from a lookup table.

5. A method as claimed in claim 3, wherein for each of the k pairs of corresponding samples the respective value of $x_k$ is determined by:
- detecting the maximum value of $I_k$ and $Q_k$ by determining the larger of $I_k$ and $Q_k$;
- detecting the minimum value of $I_k$ and $Q_k$ by determining the smaller of $I_k$ and $Q_k$;
- calculating a value $y_k = \frac{1}{2}\{(\text{the detected minimum value}) \div (\text{the detected maximum value})\}^2$; and
- calculating a value of $(I_k^2 + Q_k^2)^{1/2}$ as a function of $y_k$.

6. A method as claimed in claim 5, wherein the value of $(I_k^2 + Q_k^2)$ is calculated as (the detected maximum value)$\times \{(1+y_k)/2 + \frac{1}{2}(1+y_k - y_k^2 + y_k^3 - y_k^4 + y_k^5 - y_k^6)\}$.

7. A method of generating an envelope predistorted radio frequency signal, said method comprising the steps of:
- providing an envelope modulated signal including a complex baseband signal having an in-phase component I and a quadrature component Q;
- sampling the complex baseband signal to obtain k samples of the in-phase component $I_k$ and of the quadrature component $Q_k$;
- for each of the k samples determining a respective distortion factor $D_k$, wherein for each of the k samples the respective distortion factor $D_k$ is determined as $D_k = (\text{atanh}(Cu_k))/Cu_k$, where $u_k$ is the magnitude of the complex sample k of the baseband signal, and C is a constant;
- multiplying each sample of the in-phase component $I_k$ and of the quadrature component $Q_k$ by its respective distortion factor $D_k$ to obtain a predistorted in-phase component sample and a predistorted quadrature component sample;
- up-converting each of the predistorted in-phase component samples and each of the predistorted quadrature component samples to provide a sampled intermediate frequency in-phase signal and a sampled intermediate frequency quadrature signal;
- combining the sampled intermediate frequency in-phase signal and the sampled intermediate frequency quadrature signal to provide a predistorted intermediate frequency signal; and
- converting the predistorted intermediate frequency signal to an analog signal.

8. A method as claimed in claim 7, wherein for each of the k samples a segment of the respective distortion factor $D_k$ is determined from a lookup table.

9. A method of generating an envelope predistorted radio frequency signal, said method comprising the steps of:
- providing an envelope modulated signal including a complex baseband signal having an in-phase component I and a quadrature component Q;
- sampling the complex baseband signal to obtain k samples of the in-phase component $I_k$ and of the quadrature component $Q_k$;
- for each of the k samples determining a respective distortion factor $D_k$, wherein determining a respective distortion factor includes determining the magnitude $I_k$ of each of the k samples of the in-phase component and the magnitude $Q_k$ of each of the k samples of the quadrature component, for each of the k pairs of corresponding samples of the in-phase component and of the quadrature component, determining a respective value of $x_k = C \times (I_k^2 + Q_k^2)^{1/2}$, and for each value of $x_k$, determining a value of the respective distortion factor $D_k = (\text{atanh}(x_k))/x_k$ wherein C is a constant;
- multiplying each sample of the in-phase component $I_k$ and of the quadrature component $Q_k$ by its respective distortion factor $D_k$ to obtain a predistorted in-phase component sample and a predistorted quadrature component sample;
- up-converting each of the predistorted in-phase component samples and each of the predistorted quadrature component samples to provide a sampled intermediate frequency in-phase signal and a sampled intermediate frequency quadrature signal; and
- combining the sampled intermediate frequency in-phase signal and the sampled intermediate frequency quadrature signal to provide a predistorted intermediate frequency signal.

10. A method as claimed in claim 9, wherein for each value of the $x_k$ the value of atanh $(x_k)/x_k$ is determined from a lookup table.

11. A method as claimed in claim 10, wherein for each of the k pairs of corresponding samples the respective value of $x_k$ is determined by:
- detecting the maximum value of $I_k$ and $Q_k$ by determining the larger of $I_k$ and $Q_k$;
- detecting the minimum value of $I_k$ and $Q_k$ by determining the smaller of $I_k$ and $Q_k$;
- calculating a value $y_k = \frac{1}{2}\{(\text{the detected minimum value}) \div (\text{the detected maximum value})\}^2$; and
- calculating a value of $(I_k^2 + Q_k^2)^{1/2}$ as a function of $y_k$; and
- multiplying the value of $(I_k^2 + Q_k^2)^{1/2}$ by C.

12. A method as claimed in claim 11, wherein the value of $(I_k^2 + Q_k^2)$ is calculated as (the detected maximum value)$\times \{(1+y_k)/2 + \frac{1}{2}(1+y_k - y_k^2 + y_k^3 - y_k^4 + y_k^5 - y_k^6)\}$.

13. A method of generating an envelope predistorted radio frequency signal, said method comprising the steps of:
- providing an envelope modulated signal including a complex baseband signal having an in-phase component I and a quadrature component Q;
- sampling the complex baseband signal to obtain k samples of the in-phase component $I_k$ and of the quadrature component $Q_k$;
- for each of the k samples determining a respective distortion factor $D_k$;
- multiplying each sample of the in-phase component $I_k$ and of the quadrature component $Q_k$ by its respective distortion factor $D_k$ to obtain a predistorted in-phase component sample and a predistorted quadrature component sample;
- up-converting each of the predistorted in-phase component samples and each of the predistorted quadrature component samples to provide a sampled intermediate frequency in-phase signal and a sampled intermediate frequency quadrature signal;
- combining the sampled intermediate frequency in-phase signal and the sampled intermediate frequency quadrature signal to provide a predistorted intermediate frequency signal;
- amplifying the analog signal; and
- transmitting the amplified signal as a radio signal.

14. A method as claimed in claim 13, wherein for each of the k samples the respective distortion factor $D_k$ is determined as $D_k = (\text{atanh}(Wu_k))/Wu_k$, where $u_k$ is the magnitude of the complex sample k of the baseband signal, and W is a function of the amplified analog radio frequency signal.

15. A method as claimed in claim 14, wherein for each of the k samples a segment of the respective distortion factor $D_k$ is determined from a lookup table.

16. A method as claimed in claim 15, wherein for each of the k samples the respective distortion factor $D_k$ is determined by:
   determining the magnitude $I_k$ of each of the k samples of the in-phase component and the magnitude $Q_k$ of each of the k samples of the quadrature component;
   for each of the k pairs of corresponding samples of the in-phase component and of the quadrature component, determining a respective value of $x_k = W \times (I_k^2 + Q_k^2)^{1/2}$; and
   for each value of $x_k$, determining a value of the respective distortion factor $D_k = (\operatorname{atanh}(x_k))/x_k$.

17. A method as claimed in claim 16, wherein for each value of the $x_k$ the value of $\operatorname{atanh}(x_k)/x_k$ is determined from a lookup table.

18. A method as claimed in claim 16, wherein for each of the k pairs of corresponding samples the respective value of $x_k$ is determined by:
   detecting the maximum value of $I_k$ and $Q_k$ by determining the larger of $I_k$ and $Q_k$;
   detecting the minimum value of $I_k$ and $Q_k$ by determining the smaller of $I_k$ and $Q_k$;
   calculating the value $y_k = \frac{1}{2}\{(\text{the detected minimum value}) \div (\text{the detected maximum value})\}^2$;
   calculating a value of $(I_k^2 + Q_k^2)^{1/2}$ as a function of $y_k$; and
   multiplying the value of $(I_k^2 + Q_k^2)^{1/2}$ by W.

19. A method as claimed in claim 18, wherein the value of $(I_k^2 + Q_k^2)$ is calculated as (the detected maximum value)$\times \{(1+y_k)/2 + \frac{1}{2}(1+y_k - y_k^2 + y_k^3 - y_k^4 + y_k^5 - y_k^6)\}$.

20. A method as claimed in claim 13, wherein the analog signal is amplified with a transfer function of $b \times \tanh(z)$, where b represents a constant, and z represents the analog signal.

21. Apparatus for predistorting a complex baseband signal having an in-phase component I and a quadrature component Q, said apparatus comprising:
   a sampling circuit for providing k complex samples of the in-phase component $I_k$ and the quadrature component $Q_k$;
   a distortion determining circuit for determining for each of the k samples a respective distortion factor $D_k$, wherein said distortion determining circuit includes a calculation circuit for determining for each of the k complex samples the respective distortion factor $D_k = (\operatorname{atanh}(Cu_k))/Cu_k$, where $u_k$ is the magnitude of the sample k of the baseband signal, and C is a constant;
   a first multiplier for multiplying each sample of the in-phase component $I_k$ and of the quadrature component $Q_k$ by its respective distortion factor $D_k$ to obtain a predistorted in-phase component sample and a predistorted quadrature component sample;
   a second multiplier for up-converting each of the predistorted in-phase component samples and each of the predistorted quadrature component samples to provide a sampled radio frequency in-phase signal and a sampled radio frequency quadrature signal; and
   a summing circuit for combining the sampled radio frequency in-phase signal and the sampled radio frequency quadrature signal to provide a predistorted carrier signal.

22. Apparatus as claimed in claim 21, wherein said calculation circuit includes a lookup table.

23. Apparatus for predistorting a complex baseband signal having an in-phase component I and a quadrature component Q, said apparatus comprising:
   a sampling circuit for providing k complex samples of the in-phase component $I_k$ and the quadrature component $Q_k$;
   a distortion determining circuit for determining for each of the k samples a respective distortion factor $D_k$, said distortion determining circuit including a first calculation circuit for determining for each of the k pairs of corresponding samples of the in-phase component and of the quadrature component, a respective value of $x_k = C \times (I_k^2 + Q_k^2)^{1/2}$, and a second calculation circuit for determining for each value of $x_k$ a value of the respective distortion factor $D_k$ wherein C is a constant;
   a first multiplier for multiplying each sample of the in-phase component $I_k$ and of the quadrature component $Q_k$ by its respective distortion factor $D_k$ to obtain a predistorted in-phase component sample and a predistorted quadrature component sample;
   a second multiplier for up-converting each of the predistorted in-phase component samples and each of the predistorted quadrature component samples to provide a sampled radio frequency in-phase signal and a sampled radio frequency quadrature signal; and
   a summing circuit for combining the sampled radio frequency in-phase signal and the sampled radio frequency quadrature signal to provide a predistorted carrier signal.

24. Apparatus as claimed in claim 23, wherein said second calculation circuit includes a lookup table.

25. Apparatus as claimed in claim 23, wherein said first calculation circuit comprises:
   first means for detecting maximum value of $I_k$ and $Q_k$ by determining the larger of $I_k$ and $Q_k$;
   second means for detecting the minimum value of $I_k$ and $Q_k$ by determining the smaller of $I_k$ and $Q_k$;
   third means for calculating a value of $y_k = \frac{1}{2}\{(\text{the detected minimum value}) \div (\text{the detected maximum value})\}^2$; and
   fourth means for calculating a value if $(I_k^2 + Q_k^2)^{1/2}$ as a function of $y_k$.

26. Apparatus as claimed in claim 25, wherein said first means calculates the value of $(I_k^2 + Q_k^2)^{1/2}$ as (the detected maximum value)$\times \{(1+y_k)/2 + \frac{1}{2}(1+y_k - y_k^2 + y_k^3 - y_k^4 + y_k^5 - y_k^6)\}$.

27. Apparatus for predistorting a complex baseband signal having an in-phase component I and a quadrature component Q, said apparatus comprising:
   a sampling circuit for providing k complex samples of the in-phase component $I_k$ and the quadrature component $Q_k$;
   a distortion determining circuit for determining for each of the k samples a respective distortion factor $D_k$;
   a first multiplier for multiplying each sample of the in-phase component $I_k$ and of the quadrature component $Q_k$ by its respective distortion factor $D_k$ to obtain a predistorted in-phase component sample and a predistorted quadrature component sample;
   a second multiplier for up-converting each of the predistorted in-phase component samples and each of the predistorted quadrature component samples to provide a sampled radio frequency in-phase signal and a sampled radio frequency quadrature signal; and
   a summing circuit for combining the sampled radio frequency in-phase signal and the sampled radio frequency quadrature signal to provide a predistorted carrier signal, wherein said sampling circuit, said distortion determining circuit, said first and second multipliers, and said summing circuit comprise a gate array.

28. Apparatus as claimed in claim 27, wherein said gate array is a field programmable gate array.

29. Apparatus for generating an envelope predistorted radio frequency signal, said apparatus comprising:

a source of an envelope modulated signal including a complex baseband signal having an in-phase component I and a quadrature component Q;

a sampling circuit for providing k complex samples of the in-phase component $I_k$ and the quadrature component $Q_k$;

a distortion determining circuit for determining for each of the k samples a respective distortion factor $D_k$, wherein said distortion determining circuit includes a calculation circuit for determining for each of the k samples the respective distortion factor $D_k=(\text{atanh}(Cu_k))/Cu_k$, where $u_k$ is the magnitude of the complex sample k of the baseband signal, and C is a constant;

a first multiplier for multiplying each sample of the in-phase component $I_k$ and of the quadrature component $Q_k$ by its respective distortion factor $D_k$ to obtain a predistorted in-phase component sample and a predistorted quadrature component sample;

a second multiplier for up-converting each of the predistorted in-phase component samples and each of the predistorted quadrature component samples to provide a sampled intermediate frequency in-phase signal and a sampled intermediate frequency quadrature signal;

a summing circuit for combining the sampled intermediate frequency in-phase signal and the sampled intermediate frequency quadrature signal to provide a predistorted intermediate frequency signal; and a digital-to-analog converter for converting the predistorted intermediate frequency signal to an analog signal.

30. Apparatus as claimed in claim 29, wherein said calculation circuit includes a lookup table.

31. Apparatus for generating an envelope predistorted radio frequency signal, said apparatus comprising:

a source of an envelope modulated signal including a complex baseband signal having an in-phase component I and a quadrature component Q;

a sampling circuit for providing k complex samples of the in-phase component $I_k$ and the quadrature component $Q_k$;

a distortion determining circuit for determining for each of the k samples a respective distortion factor $D_k$, said distortion determining circuit including a first calculation circuit for determining for each of the k pairs of corresponding samples of the in-phase component and of the quadrature component, a respective value of $x_k=C\times(I_k^2+Q_k^2)^{1/2}$, and a second calculation circuit for determining for each value of $x_k$ a value of the respective distortion factor $D_k$ wherein C is a constant;

a first multiplier for multiplying each sample of the in-phase component $I_k$ and of the quadrature component $Q_k$ by its respective distortion factor $D_k$ to obtain a predistorted in-phase component sample and a predistorted quadrature component sample;

a second multiplier for up-converting each of the predistorted in-phase component samples and each of the predistorted quadrature component samples to provide a sampled intermediate frequency in-phase signal and a sampled intermediate frequency quadrature signal;

a summing circuit for combining the sampled intermediate frequency in-phase signal and the sampled intermediate frequency quadrature signal to provide a predistorted intermediate frequency signal; and a digital-to-analog converter for converting the predistorted intermediate frequency signal to an analog signal.

32. Apparatus as claimed in claim 31, wherein said second calculation circuit includes a lookup table.

33. Apparatus for generating an envelope predistorted radio frequency signal, said apparatus comprising:

a source of an envelope modulated signal including a complex baseband signal having an in-phase component I and a quadrature component Q;

a sampling circuit for providing k complex samples of the in-phase component $I_k$ and the quadrature component $Q_k$;

a distortion determining circuit for determining for each of the k samples a respective distortion factor $D_k$, wherein said distortion determining circuit includes a calculation circuit for determining for each of the k complex samples the respective distortion factor $D_k=(\text{atanh}(Wu_k))/Wu_k$, where $u_k$ is the magnitude of the complex baseband signal, and W is a function of the predistorted radio frequency signal;

a first multiplier for multiplying each sample of the in-phase component $I_k$ and of the quadrature component $Q_k$ by its respective distortion factor $D_k$ to obtain a predistorted in-phase component sample and a predistorted quadrature component sample;

a second multiplier for up-converting each of the predistorted in-phase component samples and each of the predistorted quadrature component samples to provide a sampled intermediate frequency in-phase signal and a sampled intermediate frequency quadrature signal;

a summing circuit for combining the sampled intermediate frequency in-phase signal and the sampled intermediate frequency quadrature signal to provide a predistorted intermediate frequency signal; and a digital-to-analog converter for converting the predistorted intermediate frequency signal to an analog signal.

34. Apparatus as claimed in claim 33, wherein said calculation circuit includes a lookup table.

35. Apparatus for generating an envelope predistorted radio frequency signal, said apparatus comprising:

a source of an envelope modulated signal including a complex baseband signal having an in-phase component I and a quadrature component Q;

a sampling circuit for providing k complex samples of the in-phase component $I_k$ and the quadrature component $Q_k$;

a distortion determining circuit for determining for each of the k samples a respective distortion factor $D_k$, said distortion determining circuit including a first calculation circuit for determining for each of the k pairs of corresponding samples of the in-phase component and of the quadrature component, a respective value of $x_k=W\times(I_k^2+Q_k^2)^{1/2}$, and a second calculation circuit for determining for each value of $x_k$ a value of the respective distortion factor $D_k$ wherein W is a function of the predistorted radio frequency signal;

a first multiplier for multiplying each sample of the in-phase component $I_k$ and of the quadrature component $Q_k$ by its respective distortion factor $D_k$ to obtain a predistorted in-phase component sample and a predistorted quadrature component sample;

a second multiplier for up-converting each of the predistorted in-phase component samples and each of the predistorted quadrature component samples to provide a sampled intermediate frequency in-phase signal and a sampled intermediate frequency quadrature signal;

a summing circuit for combining the sampled intermediate frequency in-phase signal and the sampled intermediate frequency quadrature signal to provide a predistorted intermediate frequency signal; and a digital-to-analog converter for converting the predistorted intermediate frequency signal to an analog signal.

36. Apparatus as claimed in claim 35, wherein said second calculation circuit includes a lookup table.

37. Apparatus as claimed in claim 35, wherein said first calculation circuit comprises:

first means for detecting the maximum value of $I_k$ and $Q_k$ by determining the larger of $I_k$ and $Q_k$;

second means for detecting the minimum value of $I_k$ and $Q_k$ by determining the smaller of $I_k$ and $Q_k$;

third means for calculating a value of $y_k = \frac{1}{2}\{(\text{the detected minimum value}) \div (\text{the detected maximum value})\}^2$; and fourth means for calculating a value if $(I_k^2 + Q_k^2)^{1/2}$ as a function of $y_k$.

38. Apparatus as claimed in claim 37, wherein said first means calculates the value of $(I_k^2 + Q_k^2)^{1/2}$ as (the detected maximum value)$\times\{(1+y_k)/2 + \frac{1}{2}(1 + y_k - y_k^2 + y_k^3 - y_k^4 + y_k^5 - y_k^6)\}$.

39. Apparatus for generating an envelope predistorted radio frequency signal, said apparatus comprising:

a source of an envelope modulated signal including a complex baseband signal having an in-phase component I and a quadrature component Q;

a sampling circuit for providing k complex samples of the in-phase component $I_k$ and the quadrature component $Q_k$;

a distortion determining circuit for determining for each of the k samples a respective distortion factor $D_k$;

a first multiplier for multiplying each sample of the in-phase component $I_k$ and of the quadrature component $Q_k$ by its respective distortion factor $D_k$ to obtain a predistorted in-phase component sample and a predistorted quadrature component sample;

a second multiplier for up-converting each of the predistorted in-phase component samples and each of the predistorted quadrature component samples to provide a sampled intermediate frequency in-phase signal and a sampled intermediate frequency quadrature signal;

a summing circuit for combining the sampled intermediate frequency in-phase signal and the sampled intermediate frequency quadrature signal to provide a predistorted intermediate frequency signal; and a digital-to-analog converter for converting the predistorted intermediate frequency signal to an analog signal, wherein said sampling circuit, said distortion determining circuit, said first and second multipliers, and said summing circuit comprise a gate array.

40. Apparatus as claimed in claim 39, wherein said gate array is a field programmable gate array.

* * * * *